(12) United States Patent
Liang et al.

(10) Patent No.: US 12,198,926 B2
(45) Date of Patent: Jan. 14, 2025

(54) SILICON NITRIDE FILMS HAVING REDUCED INTERFACIAL STRAIN

(71) Applicant: Psiquantum, Corp., Palo Alto, CA (US)

(72) Inventors: Yong Liang, Niskayuna, NY (US); Ann Melnichuk, Rio Rancho, NM (US)

(73) Assignee: Psiquantum, Corp., Palo Alto, CA (US)

( * ) Notice: Subject to any disclaimer, the term of this patent is extended or adjusted under 35 U.S.C. 154(b) by 399 days.

(21) Appl. No.: 17/377,135

(22) Filed: Jul. 15, 2021

(65) Prior Publication Data

US 2022/0037145 A1 Feb. 3, 2022

Related U.S. Application Data

(60) Provisional application No. 63/059,742, filed on Jul. 31, 2020.

(51) Int. Cl.
*H01L 21/02* (2006.01)
*H01L 21/683* (2006.01)

(52) U.S. Cl.
CPC .... *H01L 21/0217* (2013.01); *H01L 21/02002* (2013.01); *H01L 21/02164* (2013.01); *H01L 21/6836* (2013.01)

(58) Field of Classification Search
CPC ........... H01L 21/0217; H01L 21/02002; H01L 21/02164; H01L 21/6836
See application file for complete search history.

(56) References Cited

U.S. PATENT DOCUMENTS

| 2004/0195582 A1 | 10/2004 | Tomita et al. |
| 2005/0116333 A1 | 6/2005 | Akiyama |

(Continued)

FOREIGN PATENT DOCUMENTS

| JP | 0476951 A | 3/1992 |
| TW | 200411765 A | 7/2004 |

(Continued)

OTHER PUBLICATIONS

PCT/US2021/043320, "International Search Report and Written Opinion", Nov. 18, 2021, 9 pages.

(Continued)

*Primary Examiner* — Monica D Harrison
*Assistant Examiner* — Andre C Stevenson
(74) *Attorney, Agent, or Firm* — Kilpatrick Townsend & Stockton LLP

(57) ABSTRACT

In some embodiments a method comprises depositing a first silicon nitride layer on a top surface of a semiconductor wafer and forming one or more first gaps in the first silicon nitride layer. The one or more first gaps can relieve stress formed in the first silicon nitride layer. A first fill material is deposited on the first silicon nitride layer and the first silicon nitride layer is planarized. A second silicon nitride layer is deposited across the first silicon nitride layer and one or more second gaps are formed in the second silicon nitride layer. The one or more second gaps can relieve stress formed in the second silicon nitride layer. A second fill material is deposited across the second silicon nitride layer and the second silicon nitride layer is planarized.

21 Claims, 15 Drawing Sheets

(56) References Cited

U.S. PATENT DOCUMENTS

| | | | |
|---|---|---|---|
| 2007/0178660 A1* | 8/2007 | Miller | H01L 21/763 |
| | | | 438/424 |
| 2010/0052147 A1 | 3/2010 | Grillberger et al. | |
| 2013/0334651 A1* | 12/2013 | Doris | H01L 21/76802 |
| | | | 257/E21.546 |
| 2014/0256145 A1* | 9/2014 | Abdallah | H01L 21/0271 |
| | | | 438/703 |
| 2015/0214110 A1 | 7/2015 | Lin et al. | |
| 2020/0141801 A1* | 5/2020 | Kasahara | G02B 26/001 |
| 2022/0013401 A1* | 1/2022 | Wirz | H01L 21/4814 |

FOREIGN PATENT DOCUMENTS

| | | |
|---|---|---|
| TW | 200411771 A | 7/2004 |
| TW | 200525690 A | 8/2005 |
| WO | 2020087025 A1 | 4/2020 |

OTHER PUBLICATIONS

PCT/US2021/043320, "International Preliminary Report on Patentability", Feb. 9, 2023, 6 pages.
EP21848530.8, "Extended European Search Report", Jul. 16, 2024, 10 pages.
Pfeiffer, et al., "Photonic Damascene Process for Low-Loss, High-Confinement Silicon Nitride Waveguides", Institute of Electrical and Electronics Engineers Journal of Selected Topics in Quantum Electronics, vol. 24, No. 4, XP055714844, Jul.-Aug. 2018, pp. 1-11.
TW110127996, "Office Action", Oct. 23, 2024, 6 pages.

* cited by examiner

SILICON NITRIDE FILMS HAVING REDUCED INTERFACIAL STRAIN

CROSS-REFERENCES TO OTHER APPLICATIONS

This application claims priority to U.S. Provisional Patent Application Ser. No. 63/059,742, for "STRAIN RELIEF IN THIN FILM SILICON NITRIDE" filed on Jul. 31, 2020 which is hereby incorporated by reference in entirety for all purposes.

BACKGROUND

Currently there are a wide variety of films that can be applied to semiconductor wafers. Some of these films have a different coefficient of thermal expansion (CTE) than the wafer and can delaminate or fracture, especially when applied to large wafer (e.g., 300 mm). Additionally, certain as-deposited films have stress intrinsically due to their deposition methods, which can further exacerbate the adhesion issues between the film and the wafer. New methods of depositing films that have a mismatched CTE with the wafer are required.

SUMMARY

Some embodiments of the present disclosure relate to methods of depositing films on wafers where the films have a different CTE than the wafer. In some embodiments a method comprises providing a silicon wafer and depositing a first portion of a silicon nitride layer on the silicon wafer. First regions of the first portion of the silicon nitride layer are selectively removed along one or more dicing lanes to define one or more first gaps between areas of the first portion of the silicon nitride layer. A first fill material is deposited on the first portion of the silicon nitride layer and into the one or more first gaps. A top surface of the first portion of the silicon nitride layer is planarized such that the first fill material within the one or more first gaps is coplanar with the top surface of the first portion of the silicon nitride layer. A second portion of the silicon nitride layer is deposited such that it extends across the first portion of the silicon nitride layer and across the first fill material disposed within the one or more first gaps. Second regions of the second portion of the silicon nitride layer are removed along the one or more of the dicing lanes to define one or more second gaps between areas of the second portion of the silicon nitride layer. A second fill material is deposited on the second portion of the silicon nitride layer and into the one or more second gaps. A top surface of the second portion of the silicon nitride layer is planarized such that the second fill material within the one or more second gaps is coplanar with the top surface of the second portion of the silicon nitride layer. One or more additional layers are deposited on the top surface of the second portion of the silicon nitride layer and one or more optical devices are formed on the one or more additional layers.

In some embodiments the one or more dicing lanes includes a group of dicing lanes along which one or more first gaps and second gaps are defined. In various embodiments the group includes a repetitive spacing between each of the one or more dicing lanes. In some embodiments the one or more dicing lanes includes a group of dicing lanes having no gaps. In various embodiments the one or more first and second regions are selectively removed using a dicing saw or an etching process. In some embodiments the silicon wafer comprises a silicon-on-insulator series of layers.

In some embodiments a method comprises depositing a first silicon nitride layer on a top surface of a semiconductor wafer and forming one or more first gaps in the first silicon nitride layer. A first fill material is deposited on the first silicon nitride layer and the first silicon nitride layer is planarized. A second silicon nitride layer is deposited across the first silicon nitride layer and one or more second gaps are formed in the second silicon nitride layer. A second fill material is deposited across the second silicon nitride layer and the second silicon nitride layer is planarized.

In some embodiments the semiconductor wafer comprises a silicon wafer. In various embodiments the one or more first and second gaps are formed using a dicing saw or an etching process. In some embodiments the one or more first and second gaps are formed along one or more dicing lanes. In various embodiments the one or more dicing lanes includes a group of dicing lanes along which one or more first and second gaps are formed. In some embodiments the group includes a repetitive spacing between each of the one or more dicing lanes.

In various embodiments the one or more dicing lanes includes a group of dicing lanes having no gaps. In some embodiments the one or more first and second gaps are formed within one or more active regions of semiconductor die defined across the semiconductor wafer. In various embodiments the first and second fill materials comprise flowable silicon dioxide. In some embodiments the semiconductor wafer comprises a silicon-on-insulator series of layers. In various embodiments the method further comprises depositing one or more additional layers on the second silicon nitride layer and forming one or more optical devices on the one or more additional layers.

In some embodiments a wafer comprises a silicon layer and a silicon nitride layer on the silicon layer wherein the silicon nitride layer defines one or more gaps between regions of the silicon nitride layer. Silicon dioxide is disposed within the one or more gaps and has a top surface coplanar with a top surface of the silicon nitride layer. In various embodiments the wafer comprises a silicon-on insulator series of layers. In some embodiments the wafer further comprises an array of die regions separated by dicing lanes. In various embodiments the one or more gaps are defined along one or more of the dicing lanes. In some embodiments the one or more gaps are defined within one or more of the die regions.

In some embodiments a wafer is made with a method comprising the steps of depositing a first silicon nitride layer on a top surface of a semiconductor wafer and forming one or more first gaps in the first silicon nitride layer. A first fill material is deposited on the first silicon nitride layer and the first silicon nitride layer is planarized. A second silicon nitride layer is deposited across the first silicon nitride layer and one or more second gaps are formed in the second silicon nitride layer. A second fill material is deposited across the second silicon nitride layer and the second silicon nitride layer is planarized.

Numerous benefits are achieved by way of the present invention over conventional techniques. For example, embodiments of the present invention provide the ability to deposit CTE mismatched films on wafers of any size, including 300 millimeters. The deposition of the CTE mismatched films over large wafer areas enables increased production capacity and reduced cost. These and other embodiments of the invention along with many of its advantages and features are described in more detail in conjunction with the text below and attached figures.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION

Techniques disclosed herein relate generally to semiconductor wafers having at least one deposited layer that has a coefficient of thermal expansion (CTE) mismatch with the bulk wafer material. More specifically, techniques disclosed herein relate to methods of forming one or more silicon nitride layers on silicon wafers with reduced strain. Various inventive embodiments are described herein, including methods, processes, systems, devices, and the like.

In order to better appreciate the features and aspects of depositing CTE mismatched layers on semiconductor wafers according to the present disclosure, further context for the disclosure is provided in the following section by discussing one particular implementation of a silicon nitride film deposited on a 300 millimeter silicon wafer, according to embodiments of the present disclosure. These embodiments are for explanatory purposes only and other embodiments may be employed in other types of deposited layers, different compositions of semiconductor wafers and/or different sizes (e.g., diameters) of semiconductor wafers. For example, embodiments of the disclosure can be used with any semiconductor wafer that can benefit from the deposition of a layer that has a mismatched coefficient of thermal expansion (CTE) with the bulk material of the wafer. In some instances, embodiments of the disclosure are particularly well suited for use with relatively large wafers (e.g., 300 mm and above) because of the difficulty of forming CTE mismatched layers on larger wafers, however the embodiments disclosed herein are in no way limited to any size or configuration of semiconductor wafer.

Figure 1:
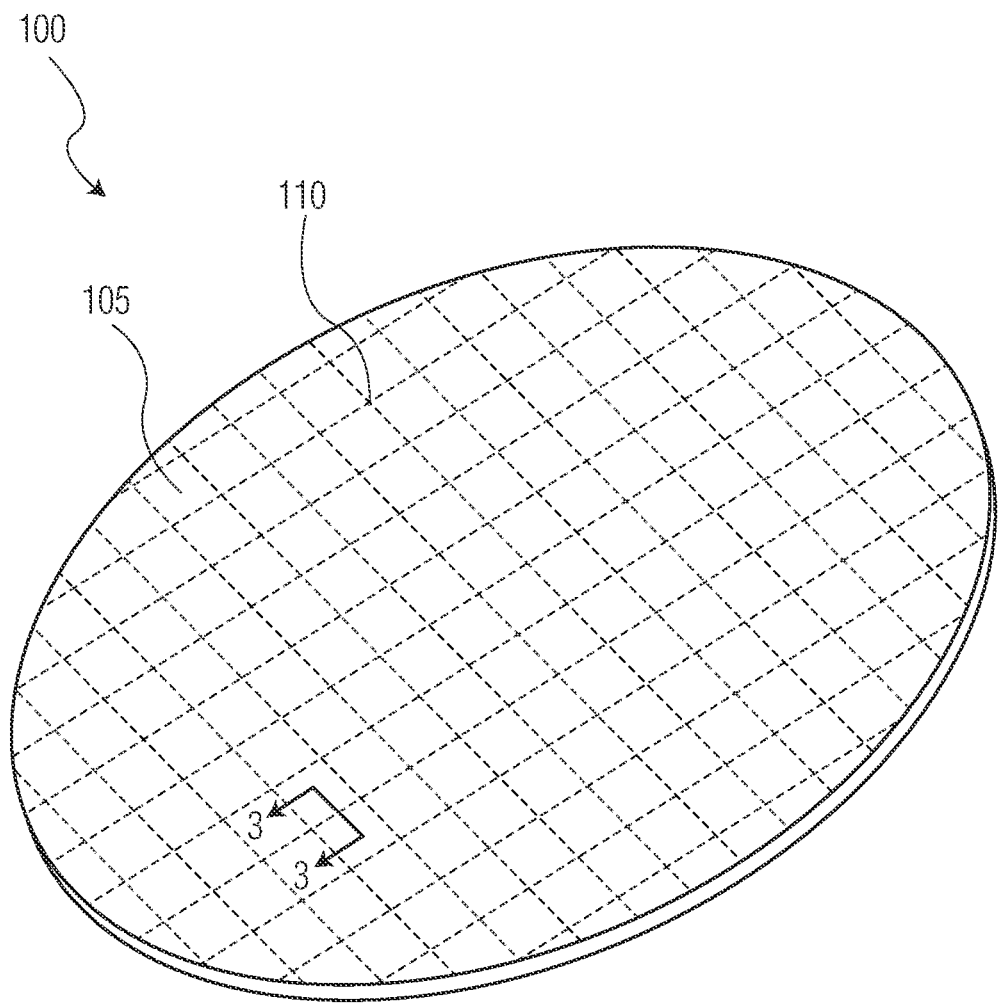
FIG. 1 is an isometric view of a semiconductor wafer according to an embodiment of the disclosure.

FIG. 1 depicts an isometric illustrative rendering of a semiconductor wafer 100, according to some embodiments of the disclosure. As shown in FIG. 1, semiconductor wafer 100 includes a plurality of individual die 105 that will be singulated along dicing lanes 110 shown by dashed lines. Wafer 100 can include a layer of silicon nitride, or other film, as described in more detail below.

Figure 2:
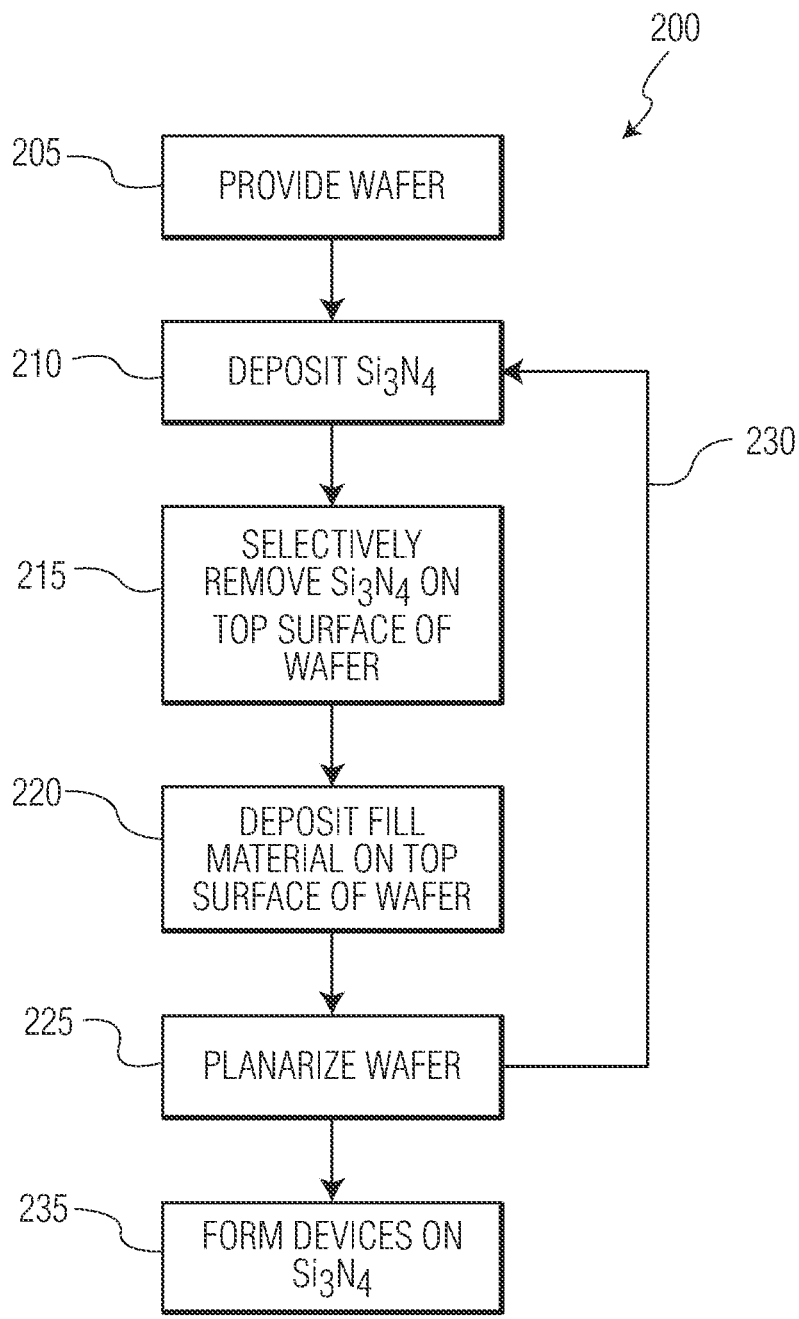
FIG. 2 is a method of forming a CTE mismatched layer on the silicon wafer illustrated in FIG. 1, according embodiments of the disclosure.

FIG. 2 illustrates steps associated with a method 200 of forming a silicon nitride layer on silicon wafer 100 of FIG. 1, according embodiments of the disclosure. FIGS. 3A-3J illustrate simplified sequential views of cross-section A-A along dicing lane 110 shown in FIG. 1, according to method 200 described in FIG. 2. Method 200 describes a process involving selective removal of portions of the silicon nitride layer in-between silicon nitride deposition steps, resulting in reduced strain between the silicon nitride layer and the silicon, as described in more detail below.

In step 205 of FIG. 2 an appropriate semiconductor wafer is provided. In some embodiments the wafer can be silicon, however in other embodiments the wafer may be, silicon on insulator (SOI), silicon with one or more pre-deposited layers, germanium, silicon germanium, gallium arsenide, silicon carbide, gallium nitride, CVD diamond or any other type of semiconducting or dielectric material. In some embodiments the wafer may be any suitable diameter, including but not limited to any of the common standards such as, 150, 200, 300, 450 millimeters. In some embodiments, the techniques disclosed herein may be beneficial for wafers having a generally larger diameter as film strain increases over larger distances, however the techniques disclosed herein are not limited to any particular size of wafer as film stresses are also determined by the CTE mismatch between the materials.

Figure 3A:
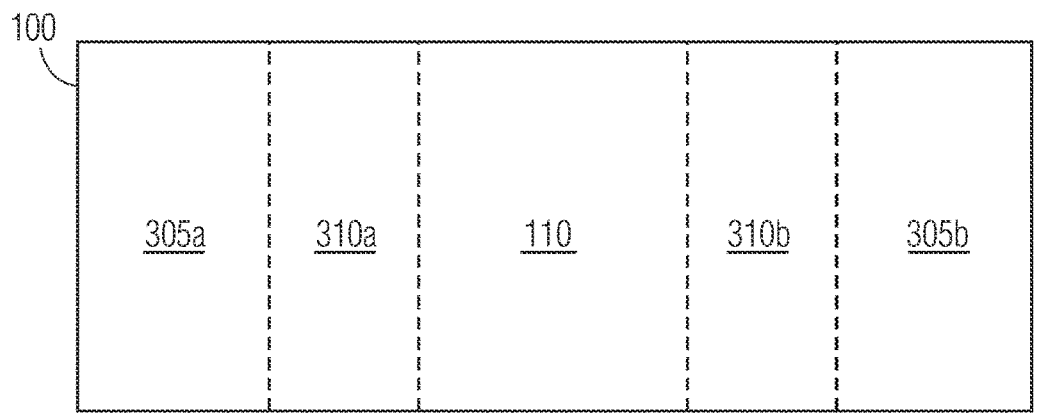
FIGS. 3A-3J illustrate simplified sequential cross-sectional views of the wafer shown in FIG. 1, according to the method described in FIG. 2.

Referring to FIG. 3A, a cross-section through dicing lane 110 (see FIG. 1) of wafer 100 is illustrated. This particular cross-section shows a portion of a first die 305a and a portion of a second die 305b. First die 305a has first die frame 310a and second die 305b has second die frame 310b. First and second die frames 310a, 310b, respectively, are inactive areas surrounding a periphery of each respective die that provide a predetermined setback for singulation operations, locations for wafer fabrication metrology structures and/or other features.

Dicing lane 110 is illustrated between first die frame 310a and second die frame 310b and is typically a "kerf" width of a dicing blade that can be any suitable width. In some embodiments a width of dicing lane 110 is between 10 microns and 500 microns, while in other embodiments the dicing lane is between 50 microns and 100 microns. In some embodiments wafer 100 is between 0.1 and 10 millimeters thick, while in other embodiments the wafer is between 0.5 and 1 millimeter thick and in further embodiments the wafer is approximately 0.7 millimeters thick.

Figure 3B:
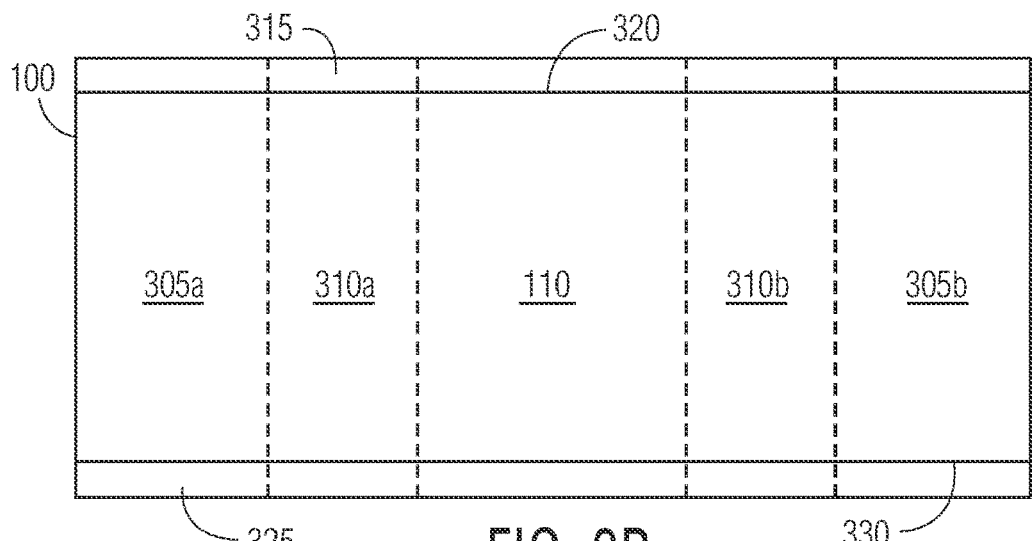

In step 210 of FIG. 2, a layer of silicon nitride is deposited on the wafer using any appropriate deposition technique. Referring to FIG. 3B, first silicon nitride layer 315 is formed on a top surface 320 of wafer 100. In some embodiment a simultaneous bottom layer of silicon nitride 325 is formed on a bottom surface 330 of wafer 100 to prevent bowing of the wafer due to unequal stress on each side. In some embodiments a simultaneous dual sided silicon nitride coating may be deposited using furnace deposition techniques while in other embodiments only first silicon nitride layer 315 may be deposited, for example when using a physical vapor deposition (PVD) or chemical vapor deposition (CVD) process. Any suitable deposition technique can be used to deposit first silicon nitride layer 315 on wafer 100. In some embodiments first silicon nitride layer 315 is between 50 and 1000 nanometers thick, while in other embodiments the first silicon nitride layer is between 100 and 300 nanometers thick and in further embodiments the first silicon nitride layer is approximately 200 nanometers thick.

Figure 3C:
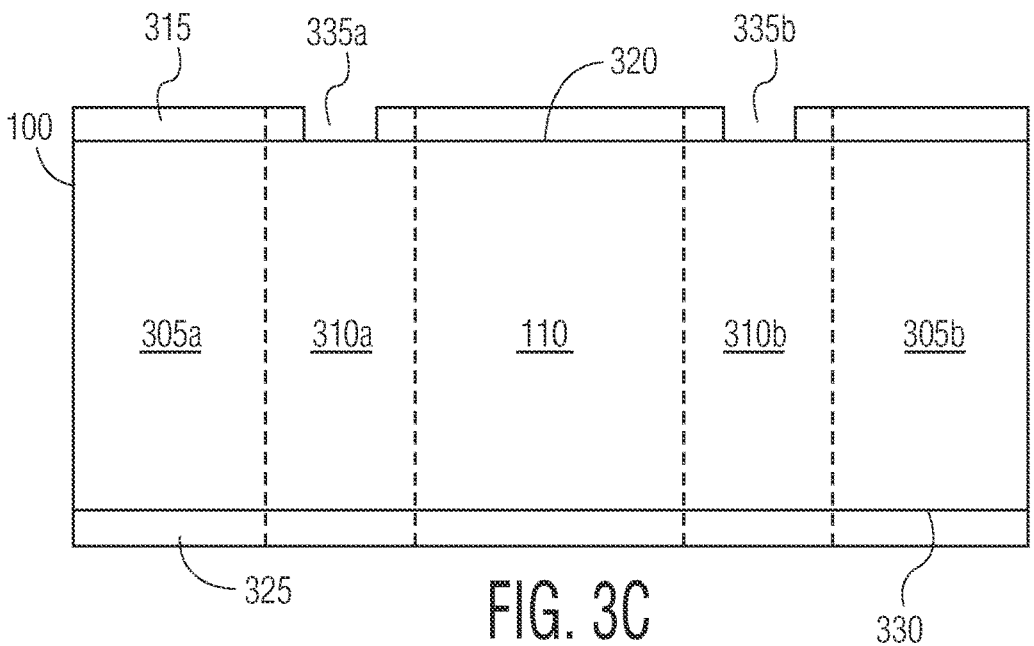

In step 215 of FIG. 2, portions of first silicon nitride layer 315 are selectively removed. Referring to FIG. 3C, a first portion 335a and a second portion 335b of first silicon nitride layer 315 are removed. In this embodiment, first portion 335a is directly over first die frame 310a and second portion 335b is directly over second die frame 310b, however in other embodiments portions of the silicon nitride layer can be removed in different locations. In some embodiments first and second portions 335a, 335b, respectively, can be removed using a semiconductor wafer dicing saw that is set at a depth of first silicon nitride layer 315, or deeper. However, in other embodiments any type of wet or dry etching process, laser ablation process or other suitable process can be used to remove first and second portions 335a, 335b, respectively. In some embodiments a width of first and second portions 335a, 335b, respectively, is between 10 microns and 500 microns, while in other embodiments the width is between 50 microns and 100 microns and in one embodiment the width is approximately 70 microns. In this particular embodiment strips of first silicon nitride layer 315 are removed along every dicing lane 110 (see FIG. 1) that exists between each die 105, however in other embodiments the strips can be removed between every other die, every third, fourth or fifth die or at any other suitable spacing.

As appreciated by one of skill in the art having the benefit of this disclosure, selective removal of strips of first silicon nitride layer 315 reduces the accumulation of stress that builds up between CTE mismatched layers, such as first silicon nitride layer 315 and silicon wafer 100. It will also be appreciated that strips oriented in a perpendicular relationship to each other will relieve stress across the entire surface of the wafer. In some embodiments, where the CTE mismatch is relatively large, the spacing between the strips of removed material may be reduced while in embodiments that have lower CTE mismatch the spacing between the strips may be increased. Further, in some embodiments the spacing between the strips located proximate a center of the wafer may be greater than the spacing at the edges of the wafer as the film strain can accumulate from the center (e.g., neutral axis) of the wafer. In yet further embodiments, the strips may not be aligned with the dicing lanes and may be positioned at other suitable locations on the wafer, for example, aligned with geometry of features formed on each die.

Figure 3D:
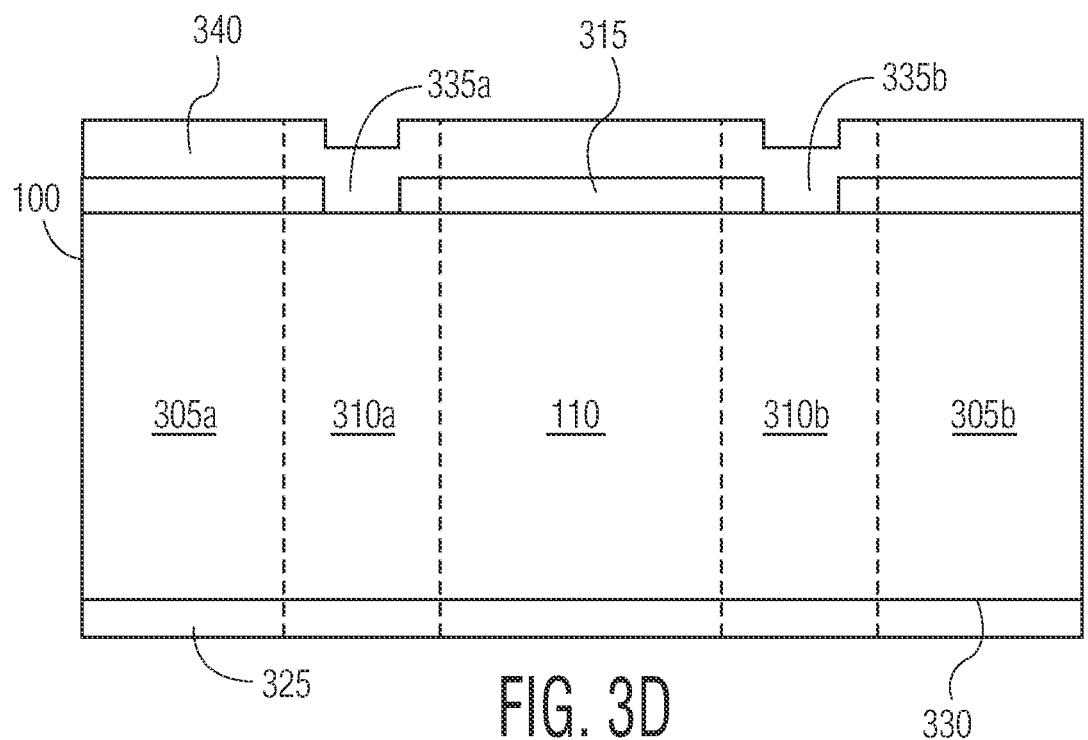

In step 220 of FIG. 2, a fill material is deposited on the first silicon nitride layer. Referring to FIG. 3D, fill material 340 is deposited on first silicon nitride layer 315. In some embodiments fill material 340 may be what is known as a flowable silicon dioxide that can flow at relatively low temperatures (e.g., approximately 400° C.), however in other embodiments it may be a "high quality" silicon dioxide material that flows at relatively higher temperatures (e.g., 600-650° C.). Any suitable silicon dioxide or other fill material, for example phosphosilicate glass (PSG) or borophosphosilicate glass (PBSG), can be used to fill first and second portions 335a, 335b, respectively.

Figure 3E:
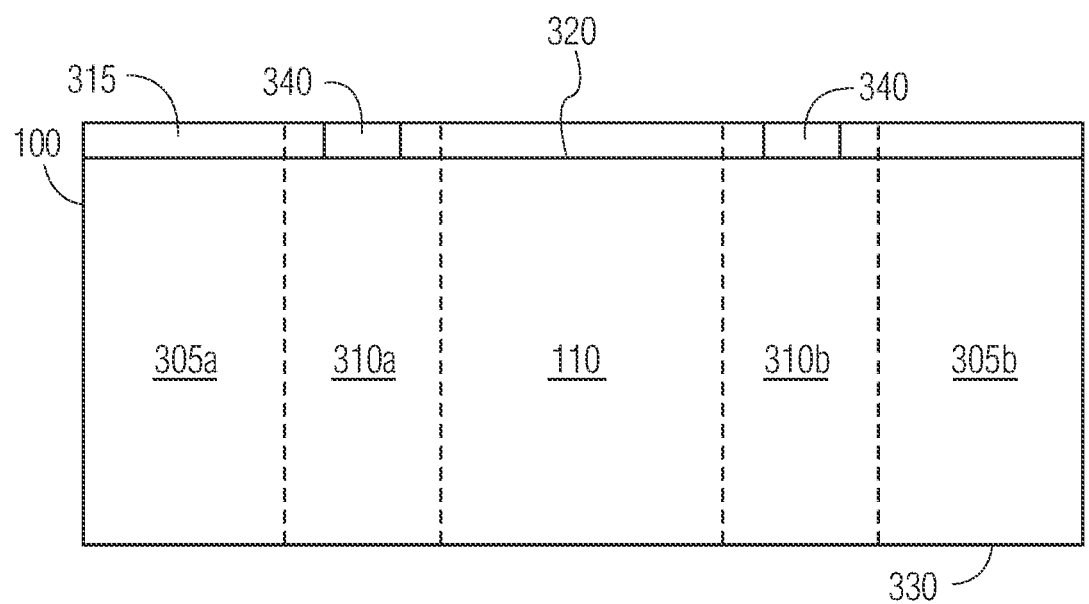

In step 225 of FIG. 2, the wafer is planarized. Referring to FIG. 3E, wafer 100 is planarized to remove excess fill material 340 such the fill material and first silicon nitride layer 315 are coplanar. In some embodiments, in which bottom layer of silicon nitride 325 (see FIG. 3B) was deposited on bottom surface 330 of wafer 100, the bottom layer can also be removed during the planarization process. In some embodiments planarization can be performed using chemical mechanical polishing (CMP), however any other suitable process such as, for example, wet or dry etching can be used. An optional thermal treatment step that improves the quality of the deposited silicon nitride layer can be employed between the silicon nitride deposition and the silicon dioxide deposition. Alternatively, the thermal treatment step can be employed after the silicon dioxide deposition process or after the planarization step.

Depending upon the desired final thickness of silicon nitride layer 315, the deposition, selective removal and planarization steps (e.g., steps 210 through 225) can be repeated via loop 230. In this embodiment these steps are repeated a second time, however the steps can be repeated any suitable number of times.

Figure 3F:
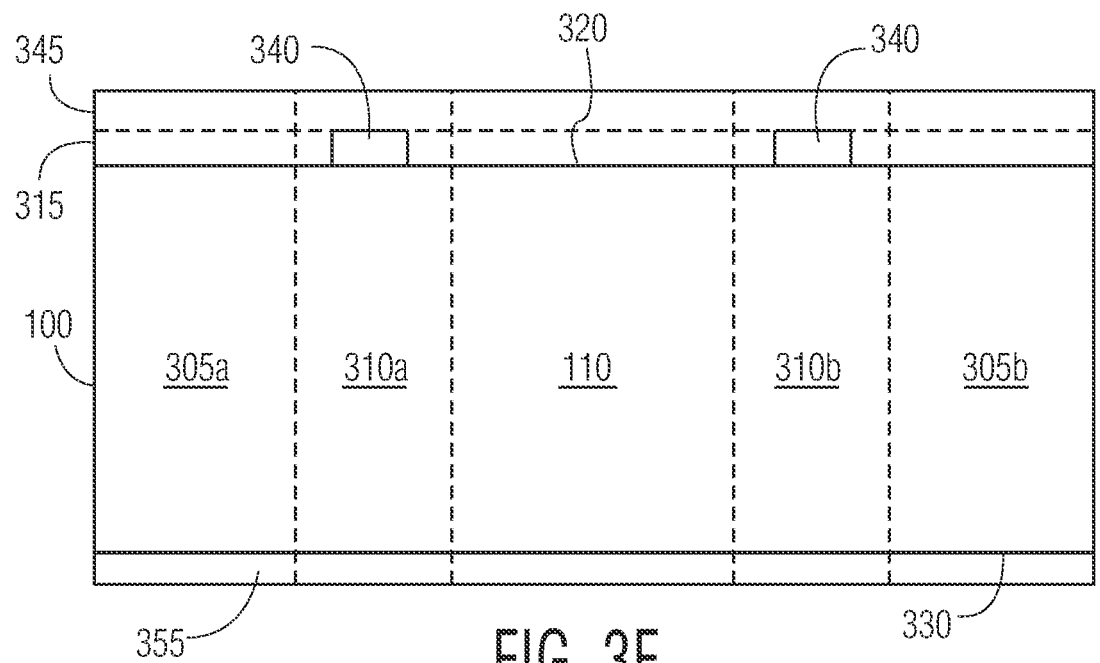

In a first repetition of step 210 of FIG. 2, a second layer of silicon nitride is deposited on the wafer using any suitable deposition technique. Referring to FIG. 3F, second silicon nitride layer 345 is formed on first silicon nitride layer 315. During the deposition process first silicon nitride layer 315 can bond to second silicon nitride layer 345. In some embodiments appropriate cleaning and surface preparation of first silicon nitride layer 315 is performed prior to deposition of second silicon nitride layer 345. In further embodiments a heat treatment or annealing process may be performed after deposition of second silicon nitride layer 345 to bond the second silicon nitride layer to first silicon nitride layer 315. Portions of second silicon nitride layer 345 extend over fill material 340 that is deposited in first and second portions 335a, 335b, respectively. As shown in FIG. 3F, in this embodiment a second bottom layer of silicon nitride 355 is deposited during the deposition of second layer of silicon nitride 345 to equalize stress on wafer 100.

Figure 3G:
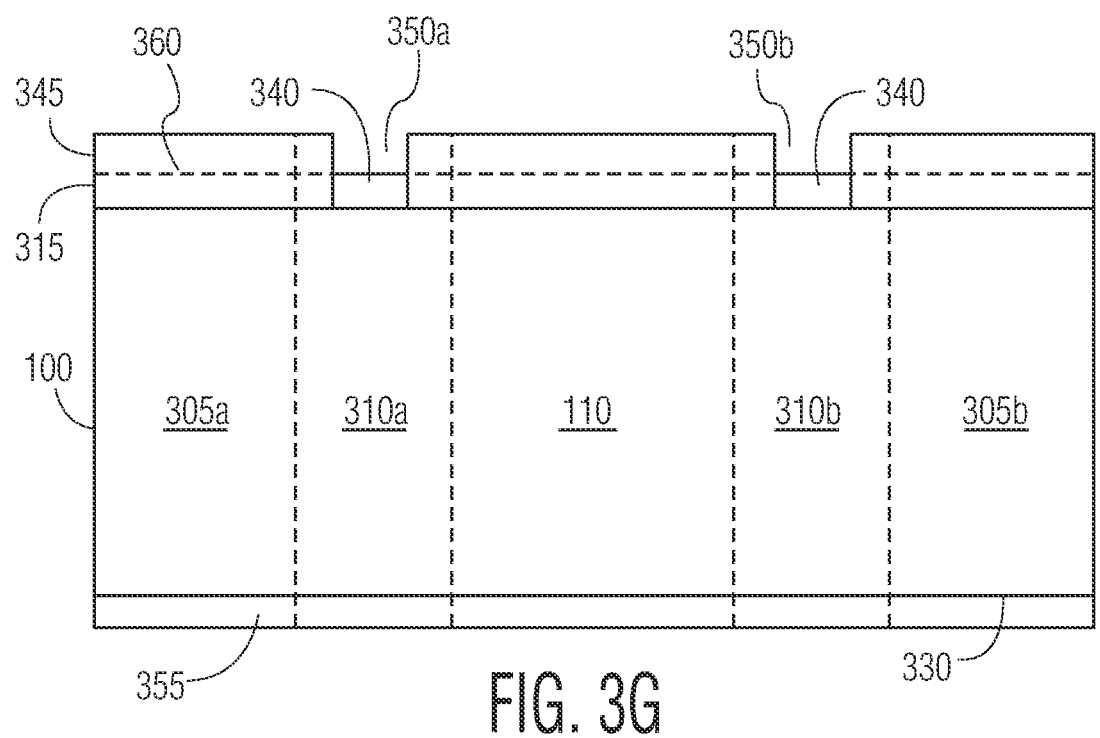

In step 215 of FIG. 2, portions of second silicon nitride layer 345 are removed. Referring to FIG. 3G, a first portion 350a and a second portion 350b of second silicon nitride layer 345 are removed deep enough to expose fill material 340.

Figure 3H:
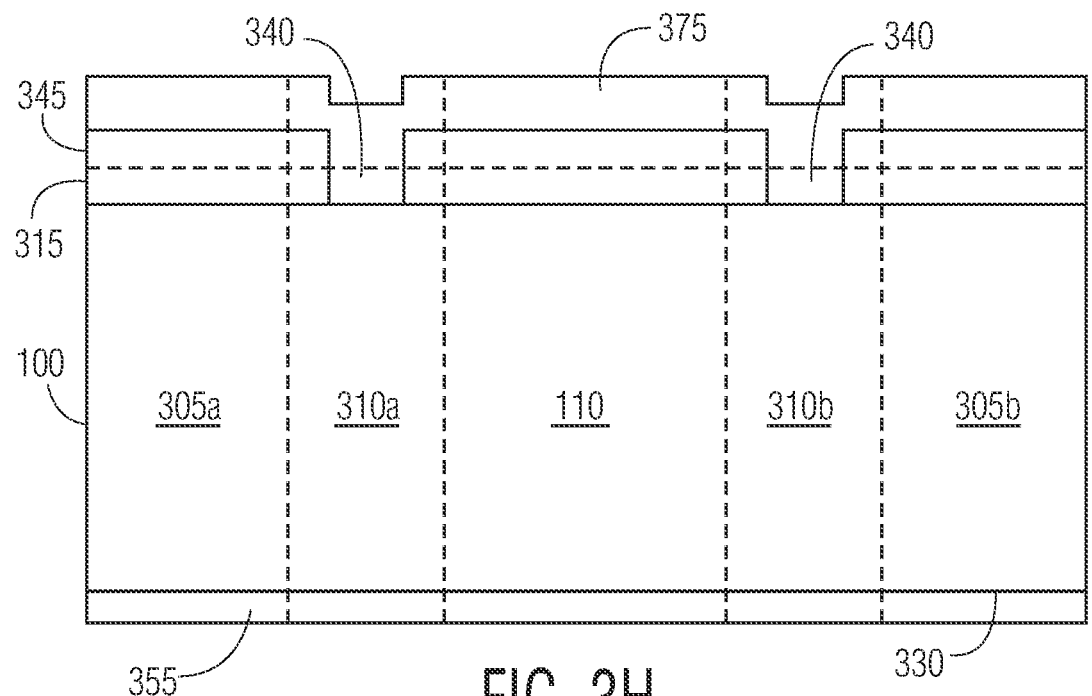

In step 220 of FIG. 2, a fill material is deposited on the second silicon nitride layer. Referring to FIG. 3H, a second layer of fill material 375 is deposited on second silicon nitride layer 345. Second layer of fill material 375 may be the same material used for first layer of fill material 340.

Figure 3I:
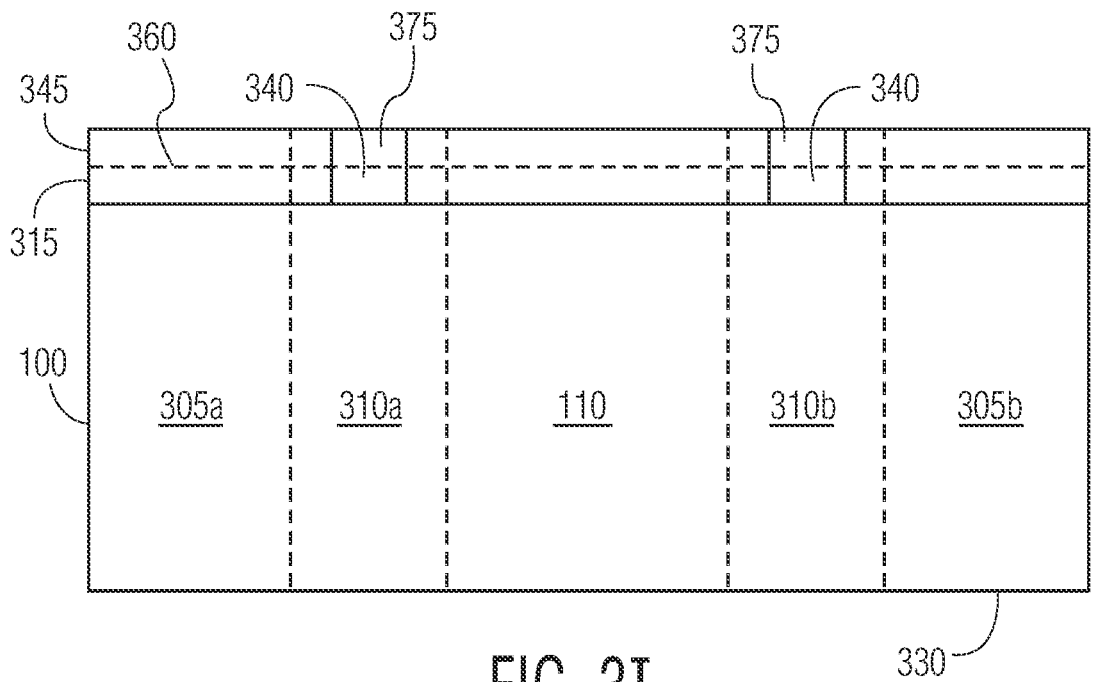

In step 225 of FIG. 2, the wafer is planarized. Referring to FIG. 3I, wafer 100 is planarized to remove excess second layer of fill material 375 such the fill material and second silicon nitride layer 345 are coplanar. In some embodiments in which a second bottom layer of silicon nitride 355 was deposited on bottom surface 330 of wafer 100, the second bottom layer can be removed during the planarization process.

In this particular embodiment first and second silicon nitride layers 315, 345, respectively, form a homogeneous silicon nitride layer 360 that is approximately 400 nanometers thick. In other embodiments the homogeneous silicon nitride layer can be between 200 and 2000 nanometers thick and in some embodiments is between 400 and 1000 nanometers thick, depending on the number of depositions and the thickness of each deposition. As described above, loop 230 can be repeated any number of times. One or more annealing steps can be performed during the fabrication process to stabilize and relieve stresses in the one or more silicon nitride layers, shown in FIG. 3I as first and second silicon nitride layers 315, 345, respectively. Any appropriate annealing temperature, duration and atmosphere can be used and in one embodiment the annealing temperature is between 800° C. and 1200° C.

Figure 3J:
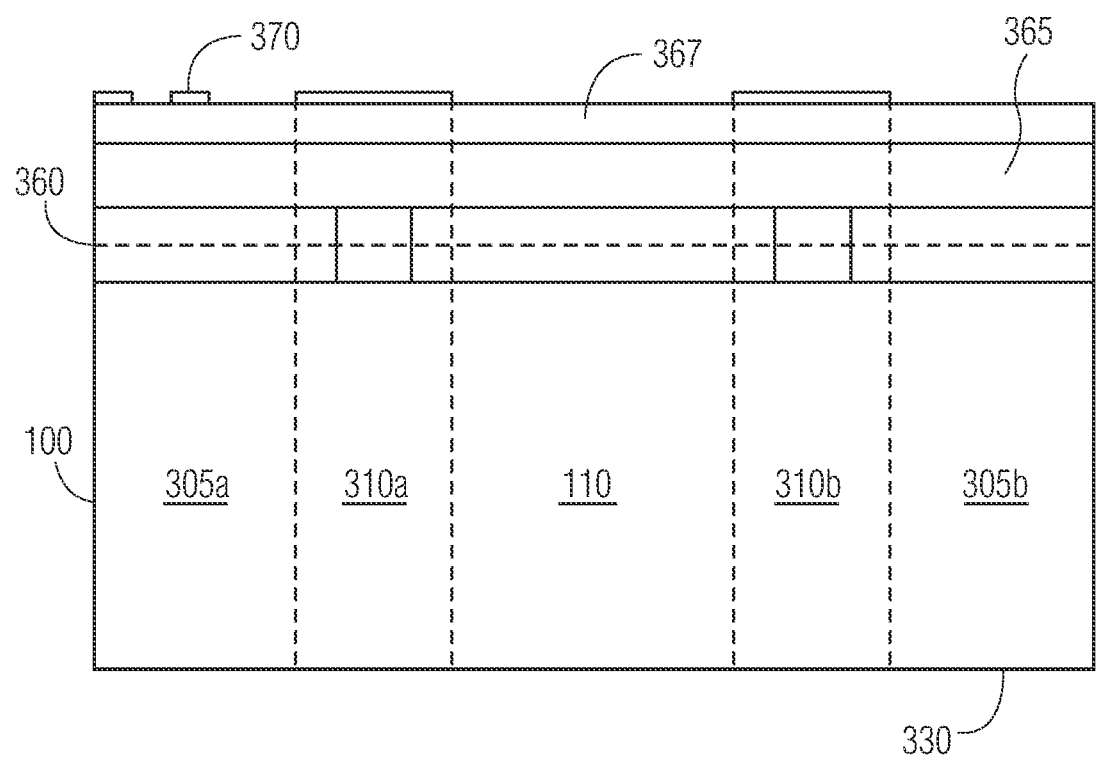

In step 235 of FIG. 2, one or more devices are formed on the homogeneous silicon nitride layer. Referring to FIG. 3J, in this particular embodiment, two additional layers 365 and 367 are formed on top of homogeneous silicon nitride layer 360 and device structures 370 are formed on the two additional layers. In other embodiments a different configuration of additional layers and/or device strictures can be formed on homogeneous silicon nitride layer 360.

It will be appreciated that method 200 is illustrative and that variations and modifications are possible. Steps described as sequential may be executed in parallel, order of steps may be varied, and steps may be modified, combined, added or omitted. For example, although the stress relieving features are illustrated as between each die (e.g., in the die frame area), in other embodiments the stress relieving features can also or alternatively be formed within each die. For example, each die can be separated into two, three, four or more separate sections which have stress-relieving features formed between each section. Some examples of process variants are illustrated below.

Figure 4A:
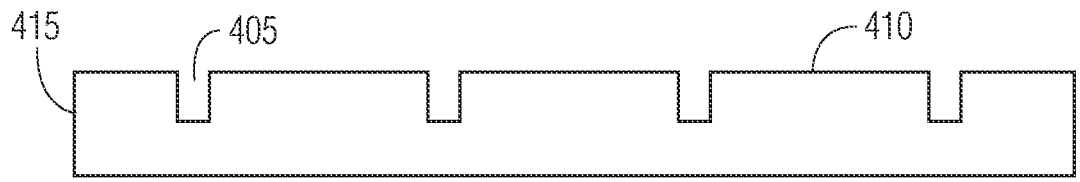
FIGS. 4A-4D illustrate steps associated with a method of depositing a CTE mismatched film on a semiconductor substrate, according to embodiments of the disclosure.

FIGS. 4A-4D illustrate steps associated with a method of depositing a film on a semiconductor substrate that is similar to method 200 illustrated in FIG. 2, however, in this embodiment trenches are formed in the wafer before silicon nitride deposition and the fill/planarization processes are not employed, as described in more detail below. More specifically, as shown in FIG. 4A, a plurality of trenches 405 are formed in a top surface 410 of silicon wafer 415. In some embodiments a dicing saw, a photolithographic etching process or other suitable process can be used to form trenches 405. As described above, in some embodiments trenches 405 may be formed in a perpendicular arrangement along either side of each dicing lane in the die frame area (see FIG. 3A and associated discussion), however in other embodiments the trenches can be formed at other suitable locations.

Figure 4B:
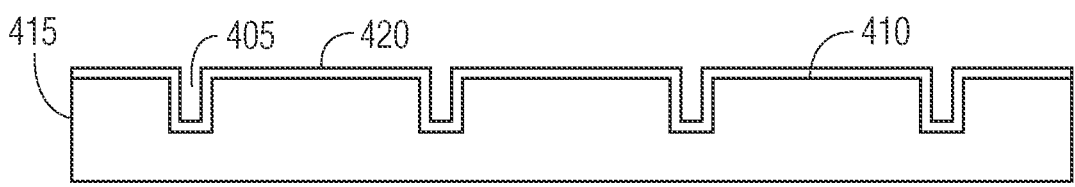
Figure 4C:
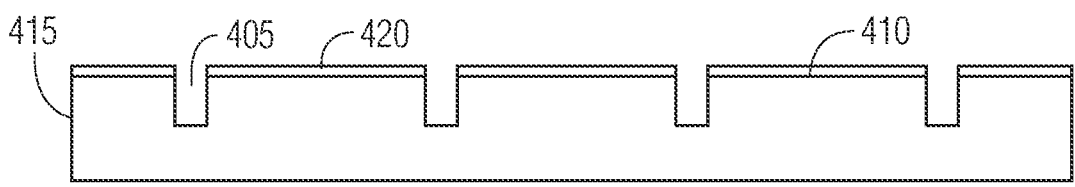
Figure 4D:
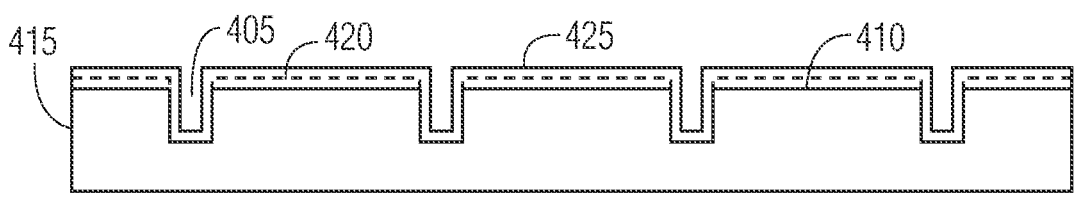

In FIG. 4B a first layer of silicon nitride 420 is deposited on top surface 410 of wafer 415 where the silicon nitride layer is also deposited within trenches 405. In some embodiments trenches 405 can be used to relieve the strain between silicon nitride layer 420 and wafer 415 so silicon nitride layers having an increased thickness and/or reduced strain can be deposited. In FIG. 4C portions of silicon nitride layer 410 are removed from trenches 405 using a dicing saw, a wet or dry etching processes or other suitable process. In FIG. 4D a second layer of silicon nitride 425 is deposited on the first layer of silicon nitride 420 forming a homogeneous silicon nitride layer. The silicon nitride deposition and removal processes can be repeated to form a silicon nitride layer of any suitable thickness. In some embodiments one or more annealing processes can be employed in the process to relieve stresses within the silicon nitride layers and/or to improve bonding between the layers. In some embodiments the presence of trenches 405 may relieve strain in the deposited silicon nitride film enough so a silicon nitride layer of suitable thickness can be grown in one deposition step.

It will be appreciated that the process shown in FIGS. 4A-4D is illustrative and that variations and modifications are possible. Steps described as sequential may be executed in parallel, order of steps may be varied, and steps may be modified, combined, added or omitted.

Figure 5A:
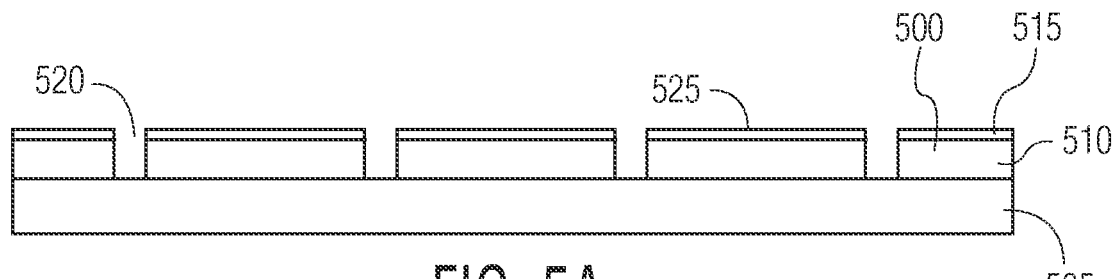
FIGS. 5A-5D illustrate steps associated with a method of depositing a CTE mismatched film on a SOI semiconductor substrate, according to embodiments of the disclosure.

FIGS. 5A-5D illustrate steps associated with a method of depositing a film on a semiconductor substrate that is similar to method 200 illustrated in FIG. 2, however, in this embodiment the wafer is a silicon-on-insulator (SOI) configuration, trenches are formed in the SOI wafer before silicon nitride deposition and the fill/planarization processes are not employed. More specifically, as shown in FIG. 5A, SOI wafer 500 includes a bottom layer of silicon 505, a middle layer of silicon dioxide 510 and a top layer of silicon 515, however other embodiments may use wafers of different materials and/or configurations. A plurality of trenches 520 are formed in top surface 525 of SOI wafer 500. In some embodiments a dicing saw, a wet or dry etching processes or other suitable process can be used to form the trenches. As described above, in some embodiments trenches 520 may be formed in a perpendicular arrangement along either side of each dicing lane in the die frame area (see FIG. 3A and associated discussion), however in other embodiments the trenches can be formed at other suitable locations.

Figure 5B:
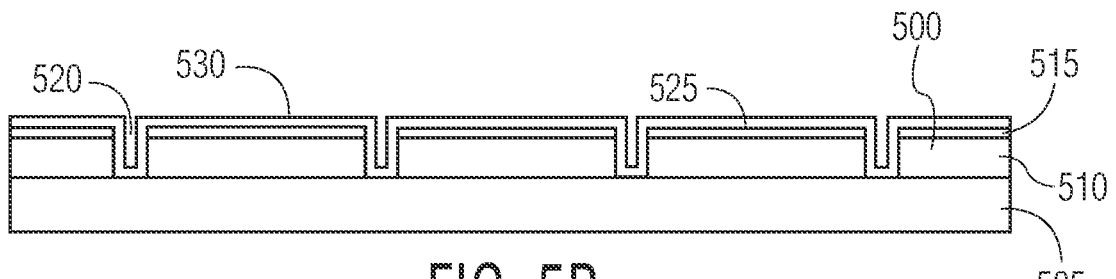
Figure 5C:
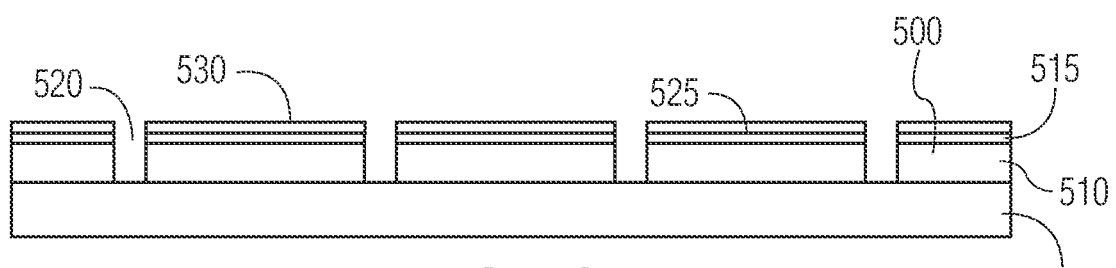
Figure 5D:
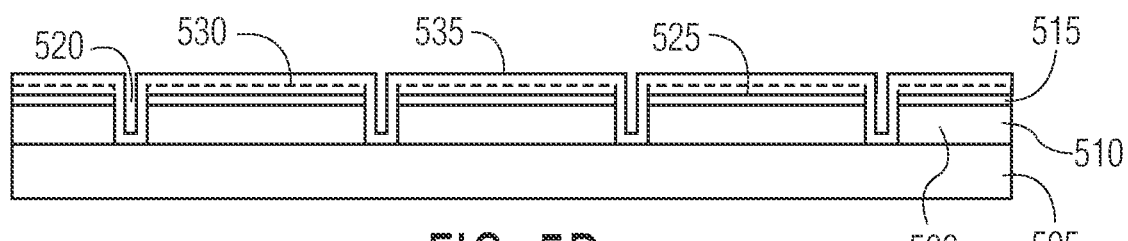

In FIG. 5B a first layer of silicon nitride 530 is deposited on top surface 525 of SOI wafer 500 where the silicon nitride layer also covers trenches 520. In some embodiments trenches 520 can be used to relieve strain between silicon nitride layer 530 and SOI wafer 500 so silicon nitride layers having an increased thickness can be deposited. In FIG. 5C portions of silicon nitride layer 530 are removed from trenches 520 using a dicing saw, a wet or dry etching processes or other suitable process. In FIG. 5D a second layer of silicon nitride 535 is deposited on first layer of silicon nitride 530 forming a homogeneous silicon nitride layer. The silicon nitride deposition and removal processes can be repeated to form a silicon nitride layer of any suitable thickness. In some embodiments one or more annealing processes can be employed in the process to relieve stresses within the silicon nitride layers and/or to improve bonding between the layers. In some embodiments the presence of trenches 520 may relieve strain in the deposited silicon nitride film enough so a silicon nitride layer of suitable thickness can be grown in one deposition step.

It will be appreciated that the process shown in FIGS. 5A-5D is illustrative and that variations and modifications are possible. Steps described as sequential may be executed in parallel, order of steps may be varied, and steps may be modified, combined, added or omitted.

Figure 6A:
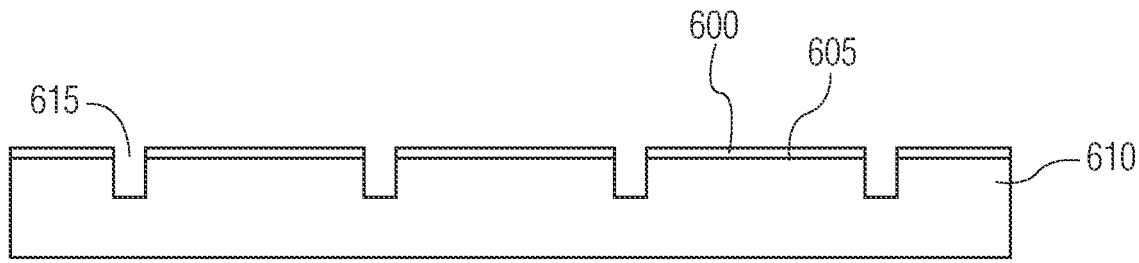
FIGS. 6A-6D illustrate steps associated with a method of depositing a CTE mismatched film on a semiconductor substrate that includes pre-formed trenches, according to embodiments of the disclosure.

FIGS. 6A-6D illustrate steps associated with a method of depositing a film on a semiconductor substrate that is similar to method 200 illustrated in FIG. 2, however, in this embodiment trenches are formed in the wafer before silicon nitride deposition and the fill/planarization processes are not employed. More specifically, as shown in FIG. 6A, a silicon dioxide layer 600 is deposited on a top surface 605 of silicon wafer 610, then trenches 615 are formed in the top surface of the wafer. In some embodiments a dicing saw, a wet or dry etching processes or other suitable process can be used to form trenches 615. As described above, in some embodiments trenches 615 may be formed in a perpendicular arrangement along either side of each dicing lane in the die frame area (see FIG. 3A and associated discussion), however in other embodiments the trenches can be formed at other suitable locations.

Figure 6B:
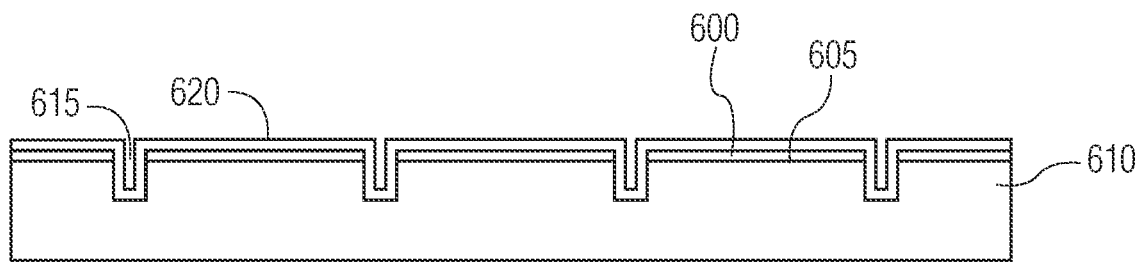
Figure 6C:
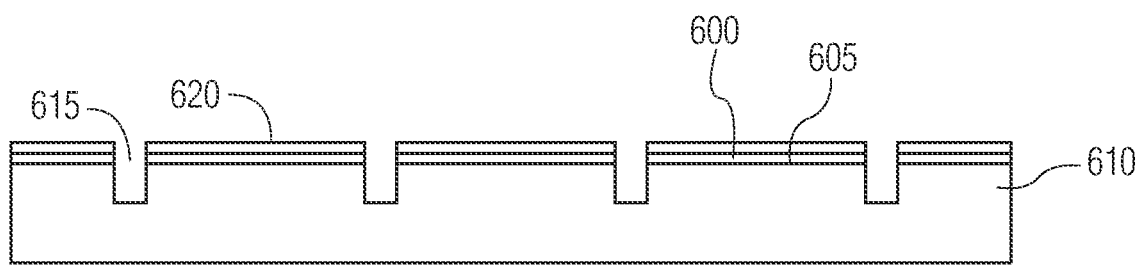
Figure 6D:
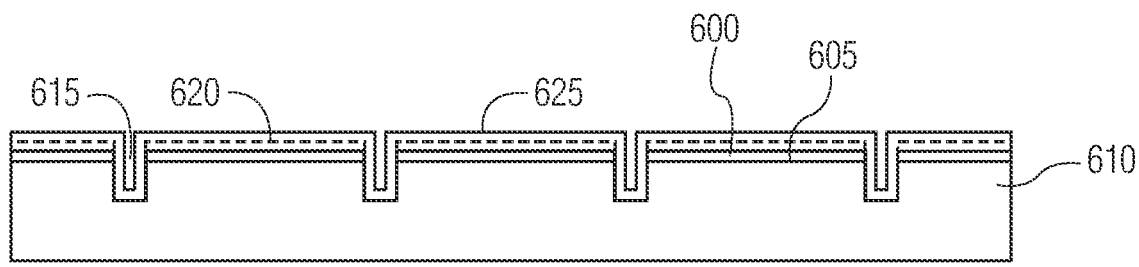

In FIG. 6B a first layer of silicon nitride 620 is deposited on silicon dioxide layer 600 where the silicon nitride layer also covers trenches 615. In some embodiments silicon dioxide layer 600 can be used to relieve strain between silicon wafer 610 and first silicon nitride layer 620. In one embodiment silicon dioxide layer 600 is configured to have a reduced modulus of elasticity when exposed to temperatures above 650° C. In one embodiment silicon dioxide layer 600 is formed with a flowable oxide, an HPD oxide, a TEOS, a thermal oxide or any other suitable process. In some embodiments trenches 615 can be used to relieve strain between first silicon nitride layer 620 and silicon wafer 610 so silicon nitride layers of relatively large thickness can be deposited. In FIG. 6C portions of first silicon nitride layer 620 are removed from trenches 615 using a dicing saw, a wet or dry etching processes or other suitable process. In FIG. 6D a second layer of silicon nitride 625 is deposited on first layer of silicon nitride 620 forming a homogeneous silicon nitride layer having increased thickness. The silicon nitride deposition and removal processes can be repeated to form a silicon nitride layer of any suitable thickness. In some embodiments one or more annealing processes can be employed in the process to relieve stresses within the silicon nitride layers and/or to improve bonding between the layers. In some embodiments the presence of trenches 615 may relieve strain in the deposited silicon nitride film enough so a silicon nitride layer of suitable thickness can be grown in one deposition step.

It will be appreciated that the process shown in FIGS. 6A-6D is illustrative and that variations and modifications are possible. Steps described as sequential may be executed in parallel, order of steps may be varied, and steps may be modified, combined, added or omitted.

Figure 7A:
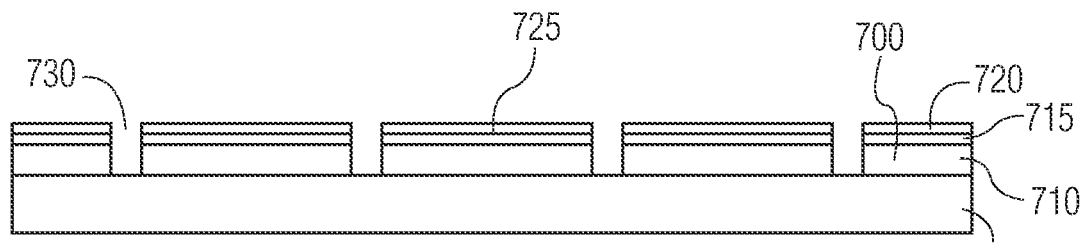
FIGS. 7A-7D illustrate steps associated with a method of depositing a film on a SOI semiconductor substrate, according to embodiments of the disclosure.

FIGS. 7A-7D illustrate steps associated with a method of depositing a film on a semiconductor substrate that is similar to method 200 illustrated in FIG. 2, however, in this embodiment the wafer is a SOI configuration, a layer of silicon dioxide is first deposited, trenches are formed in the wafer before silicon nitride deposition and the fill/planarization processes are not employed. More specifically, as shown in FIG. 7A, SOI wafer 700 includes a bottom layer of silicon 705, a middle layer of silicon dioxide 710 and a top layer of silicon 715, however other embodiments may use wafers of different materials and/or configurations. A deposited silicon dioxide layer 720 is formed on top surface 725 of SOI wafer 700, then a plurality of trenches 730 are formed in top surface 725 of the SOI wafer 700. In some embodiments a dicing saw, a wet or dry etching processes or other suitable process can be used to form trenches 730. As described above, in some embodiments trenches 730 may be formed in a perpendicular arrangement along either side of each dicing lane in the die frame area (see FIG. 3A and associated discussion), however in other embodiments the trenches can be formed at other suitable locations.

Figure 7B:
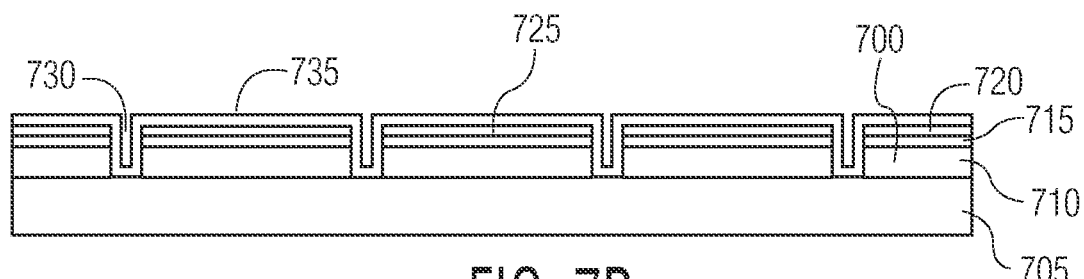

In FIG. 7B a first layer of silicon nitride 735 is deposited on deposited silicon dioxide layer 720 where the first silicon nitride layer also covers trenches 730. In some embodiments deposited silicon dioxide layer 720 can be used to relieve strain between SOI wafer 700 and first layer of silicon nitride 735. In one embodiment deposited silicon dioxide layer 720 is configured to have a reduced modulus of elasticity when exposed to temperatures above 650° C. In some embodiments the deposited silicon dioxide layer 720 is formed with a flowable oxide, an HPD oxide, a TEOS, a thermal oxide or any other suitable process. In various embodiments trenches 730 can be used to relieve the strain between first silicon nitride layer 735 and the SOI wafer 700 so silicon nitride layers having an increased thickness can be deposited.

Figure 7C:
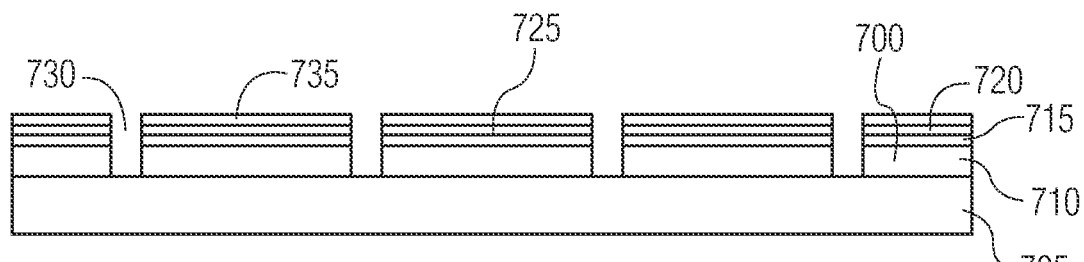
Figure 7D:
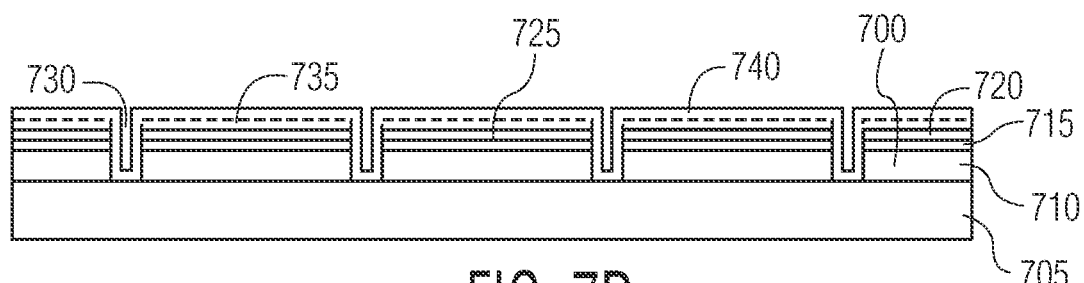

In FIG. 7C portions of first silicon nitride layer 735 are removed from trenches 730 using a dicing saw, a wet or dry etching processes or other suitable process. In FIG. 7D a second layer of silicon nitride 740 is deposited on first layer of silicon nitride 735 forming a homogeneous silicon nitride layer. The silicon nitride deposition and removal processes can be repeated to form a silicon nitride layer of any suitable thickness. In some embodiments one or more annealing processes can be employed in the process to relieve stresses within the silicon nitride layers and/or to improve bonding between the layers. In some embodiments the presence of trenches 730 may relieve strain in the deposited silicon nitride film enough so a silicon nitride layer of suitable thickness can be grown in one deposition step.

It will be appreciated that the process shown in FIGS. 7A-7D is illustrative and that variations and modifications are possible. Steps described as sequential may be executed in parallel, order of steps may be varied, and steps may be modified, combined, added or omitted.

Figure 8A:
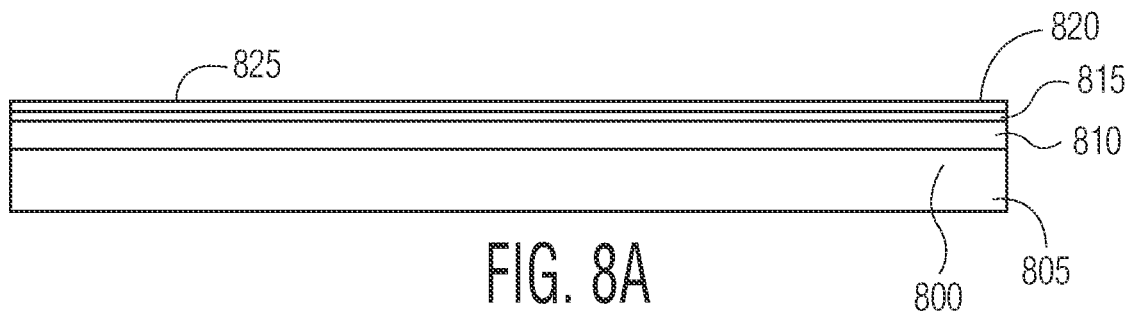
FIGS. 8A-8D illustrate steps associated with a method of depositing a film on a SOI semiconductor substrate, according to embodiments of the disclosure.
Figure 8B:
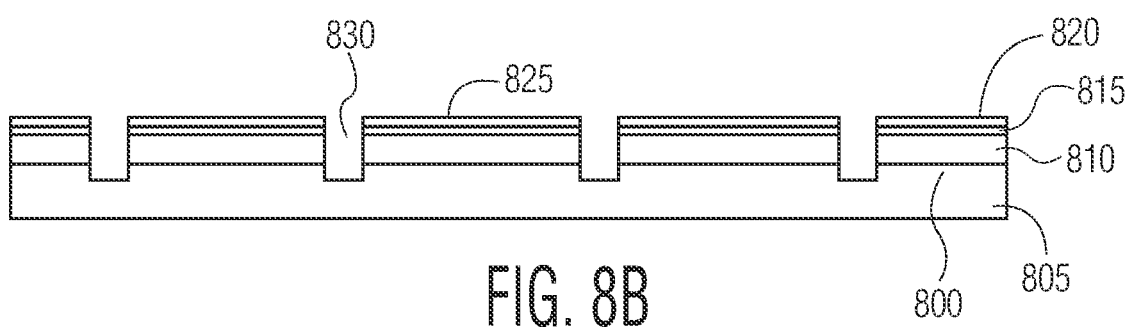

FIGS. 8A-8D illustrate steps associated with a method of depositing a film on a semiconductor substrate that is similar to method 200 illustrated in FIG. 2, however, in this embodiment the wafer is an SOI configuration. More specifically, as shown in FIG. 8A, SOI wafer 800 includes a bottom layer of silicon 805, a middle layer of silicon dioxide 810 and a top layer of silicon 815, however other embodiments may use wafers of different materials and/or configurations. A first silicon nitride layer 820 is deposited on a top surface 825 of SOI wafer 800. Optionally, a silicon dioxide layer (not shown in FIG. 8A) can be first deposited before the silicon nitride layer. In FIG. 8B a plurality of trenches 830 are formed in the top surface of the wafer. In some embodiments a dicing saw, a wet or dry etching processes or other suitable process can be used to form the trenches. As described above, in some embodiments trenches 830 may be formed in a perpendicular arrangement along either side of each dicing lane in the die frame area (see FIG. 3A and associated discussion), however in other embodiments the trenches can be formed at other suitable locations.

Figure 8C:
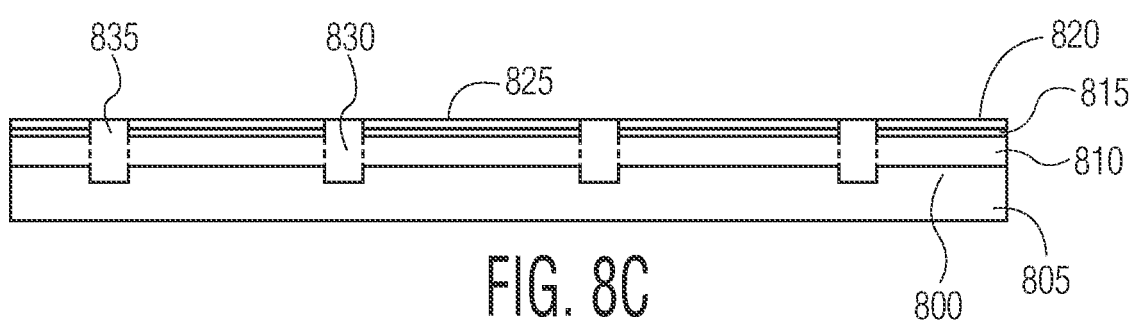
Figure 8D:
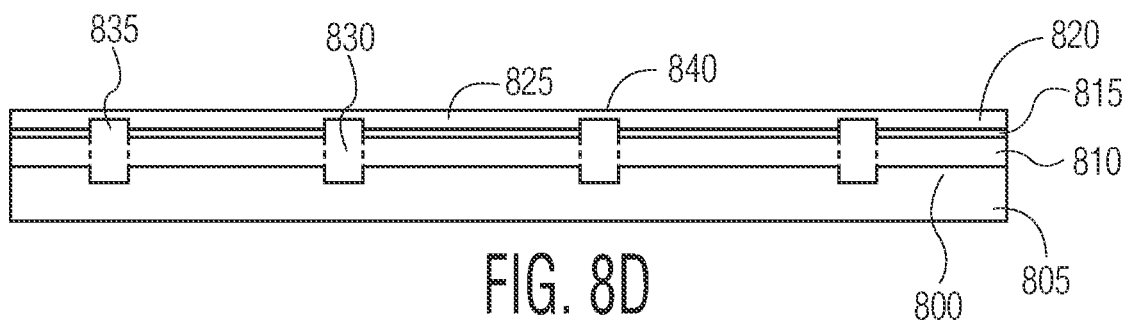

In FIG. 8C a fill material 835 that may be silicon dioxide is used to fill trenches 830 and SOI wafer 800 can be subsequently planarized using, for example, a CMP process. In FIG. 8D a second layer of silicon nitride 840 is deposited on first layer of silicon nitride 820 forming a homogeneous silicon nitride layer. The silicon nitride deposition and removal processes can be repeated to form a silicon nitride layer of any suitable thickness. In some embodiments one or more annealing processes can be employed in the process to relieve stresses within the silicon nitride layers and/or to improve bonding between the layers. In some embodiments the presence of trenches 830 may relieve strain in the deposited silicon nitride film enough so a silicon nitride layer of suitable thickness can be grown in one deposition step.

It will be appreciated that the process shown in FIGS. 8A-8D is illustrative and that variations and modifications are possible. Steps described as sequential may be executed in parallel, order of steps may be varied, and steps may be modified, combined, added or omitted.

FIGS. 9A-9F illustrate sequential steps of an embodiment that can be used to form a silicon nitride layer on a wafer. As compared to the previous embodiments in FIGS. 9A-9F, in this embodiment a silicon nitride layer is deposited at a surface of the wafer, which is removed, and a silicon nitride layer is also deposited on a lower layer, which is retained, as explained in more detail below.

Figure 9A:
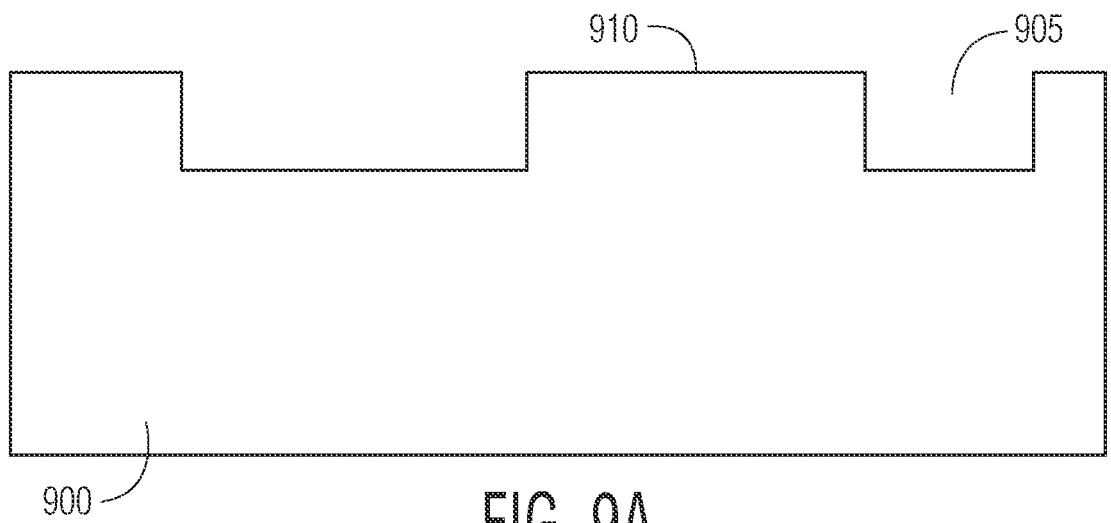
FIGS. 9A-9F illustrate steps associated with a method of depositing a film on a semiconductor substrate that includes the formation of the film at two separate layers, according to embodiments of the disclosure.

As shown in FIG. 9A, a wafer 900 is provided that has one or more recessed regions 905 formed in a top surface 910. Recessed regions 905 can be formed with a wet or dry etching process or any other suitable process. Wafer 900 can be silicon, SOI, or any other configuration, some of which are described in more detail above. In further embodiments wafer 900 may include a tetraethyl orthosilicate (TEOS) layer on a top surface in which recessed regions 905 are formed.

Figure 9B:
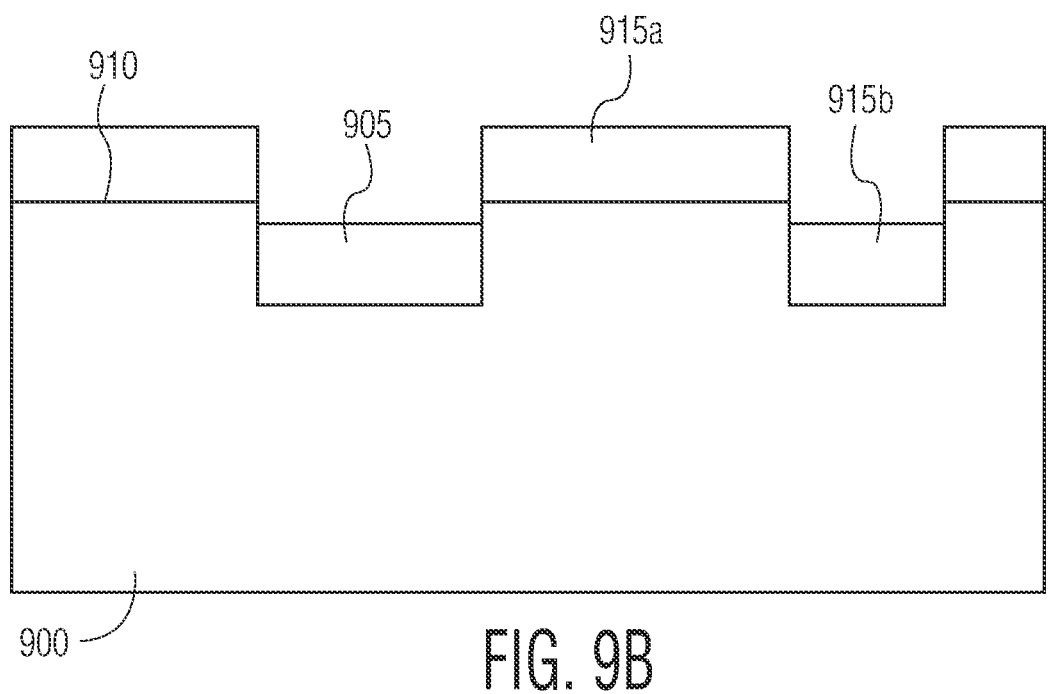

In FIG. 9B a layer of silicon nitride 915 is deposited which is divided between a top layer 915a and a lower layer 915b (e.g., formed in the recesses). In some embodiments a PVD process can be used such that little or no silicon nitride is deposited on the sidewalls of the one or more recessed regions 905. In other embodiments any suitable deposition process can be used. By depositing a silicon nitride layer 915 that is broken up into a top layer 915a and a lower layer 915b (e.g., the silicon nitride layer is not continuous) the strain between the silicon nitride layer and wafer 900 can be reduced. In some embodiments the silicon nitride layer 915 may be approximately 800 nanometers thick.

Figure 9C:
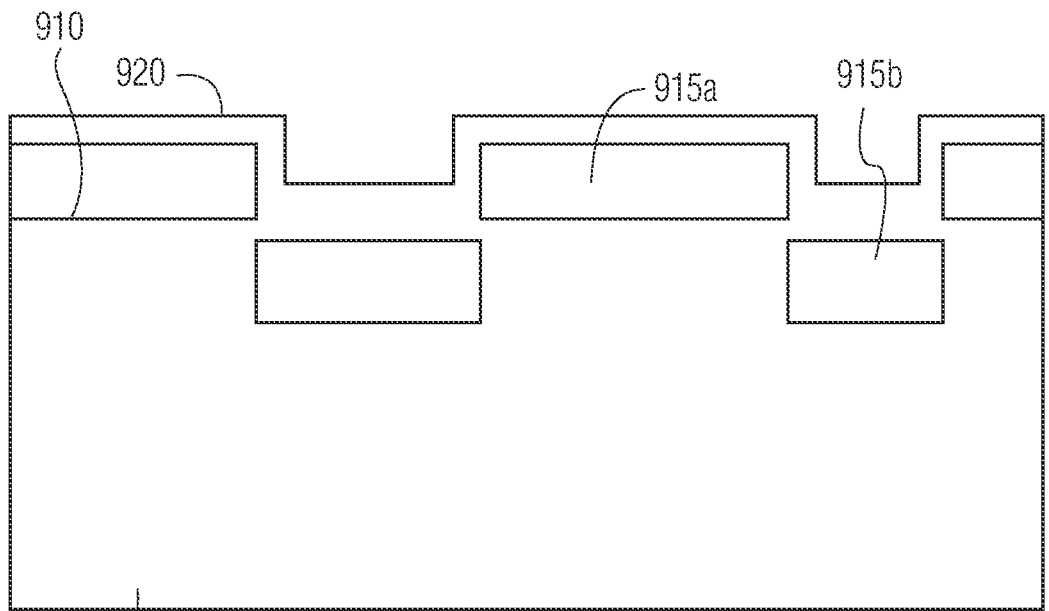
Figure 9D:
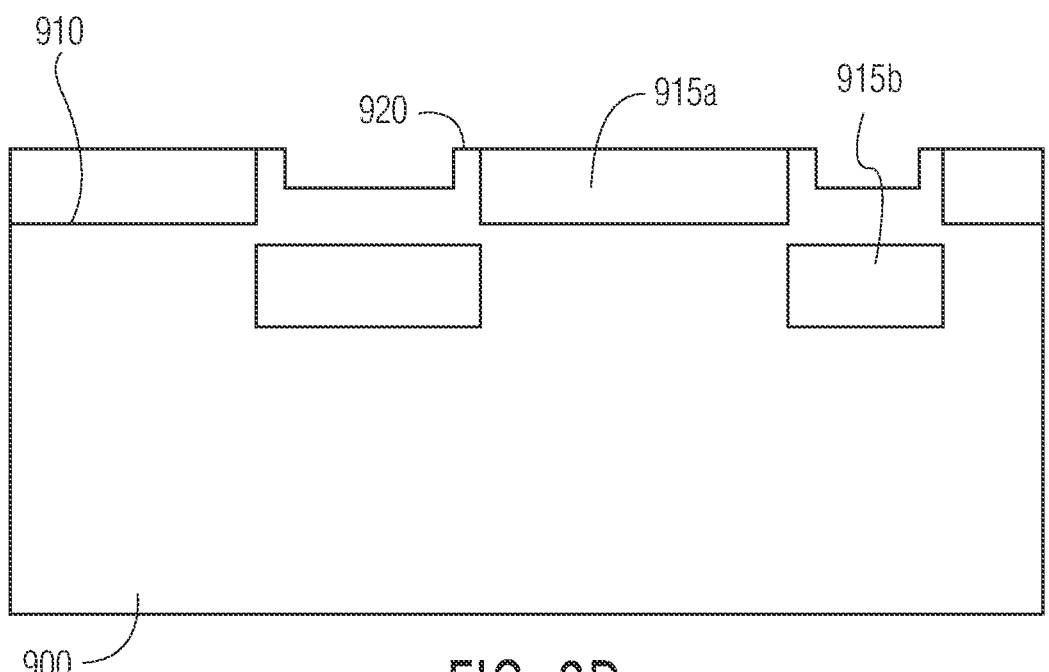
Figure 9E:
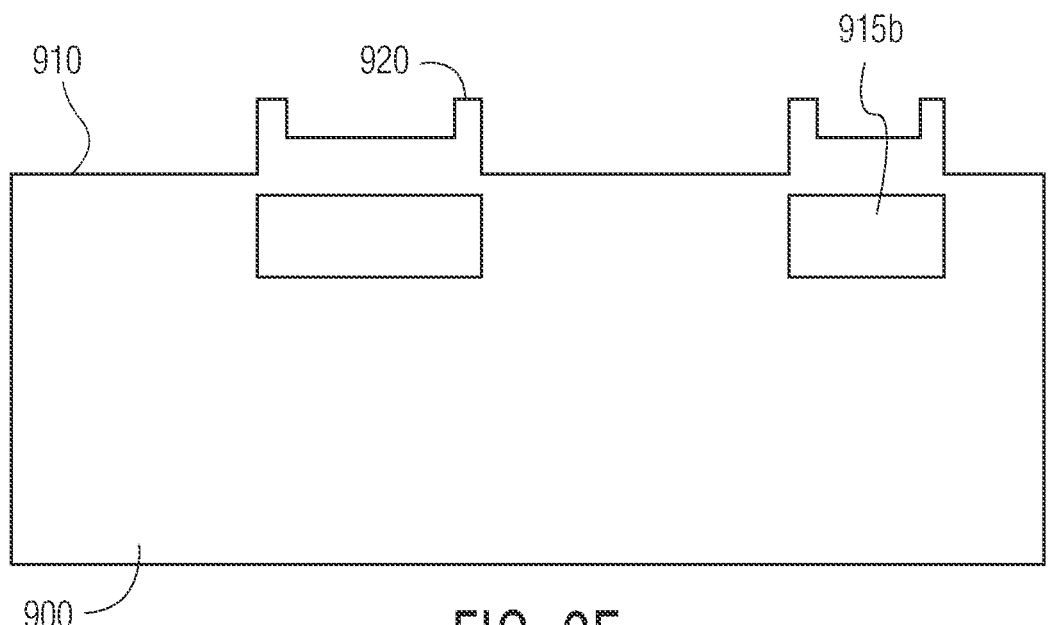
Figure 9F:
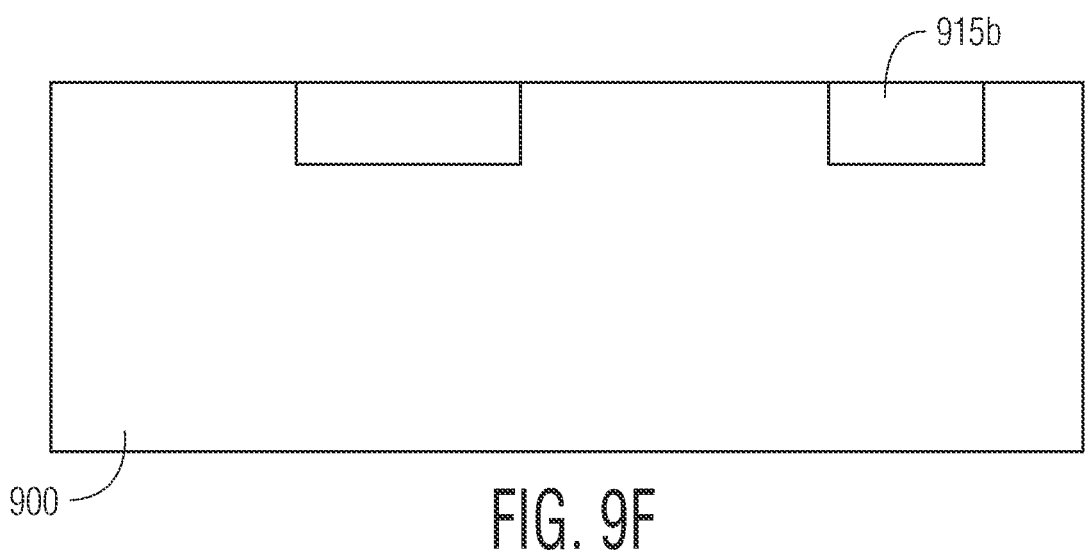

In FIG. 9C a sacrificial oxide layer 920, such as silicon dioxide can be used to cover the entire top surface of the wafer including top layer 915a and lower layer 915b of silicon nitride. In FIG. 9D the top surface of the wafer can be polished, for example with CMP, and sacrificial oxide 920 can be removed from a top surface of top layer 915a of silicon nitride. In FIG. 9E the top layer of silicon nitride can be removed. In some embodiments the removal can be performed with a hot phosphoric acid or other suitable process. In FIG. 9F the top surface of the wafer can be polished, for example with CMP, exposing the lower layer of silicon nitride which is now coplanar with the other portions of the wafer. As described above, additional layers and/or devices can then be formed on the silicon nitride.

It will be appreciated that the process shown in FIGS. 9A-9F is illustrative and that variations and modifications are possible. Steps described as sequential may be executed in parallel, order of steps may be varied, and steps may be modified, combined, added or omitted.

In further embodiments selective deposition of silicon carbide can be used to pattern the growth of a silicon nitride layer. More specifically, silicon nitride grows markedly slower on silicon carbide than on other surfaces, such as silicon or silicon dioxide. In this embodiment regions where silicon nitride is not desired are covered with silicon carbide. For example, in one embodiment the growth of a layer of silicon nitride on silicon oxide and/or silicon is approximately 100 nanometers and the corresponding growth on the silicon carbide regions is approximately 10-20 nanometers. If a larger thickness of silicon nitride is needed, the silicon nitride deposited on the silicon carbide can be removed and the growth process can be repeated.

As appreciated by one of skill in the art having the benefit of this disclosure, other materials can be used in place of the example materials described above. For example, in some embodiments other dielectrics can be used to surround the silicon nitride such as, but not limited to, silicon dioxide, aluminum oxide, silicon oxynitride, silicon carbide, silicon-oxycarbide (SiOC), or silicon-oxynitride-carbide (SiOCN). In another example in the place of silicon nitride other suitable materials such as silicon, SiON or SiOCN.

For simplicity, various process steps that include cleaning, drying, annealing and the like are not described but would be apparent to one of ordinary skill in the art having the benefit of this disclosure and are within the scope of this disclosure.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A method comprising:
   providing a silicon wafer;
   depositing a first portion of a silicon nitride layer on the silicon wafer;
   selectively removing first regions of the first portion of the silicon nitride layer along one or more dicing lanes to define one or more first gaps between areas of the first portion of the silicon nitride layer;
   depositing a first fill material on the first portion of the silicon nitride layer and into the one or more first gaps;
   planarizing a top surface of the first portion of the silicon nitride layer such that the first fill material within the one or more first gaps is coplanar with the top surface of the first portion of the silicon nitride layer;
   depositing a second portion of the silicon nitride layer such that it extends across the first portion of the silicon nitride layer and across the first fill material disposed within the one or more first gaps;
   selectively removing second regions of the second portion of the silicon nitride layer along the one or more of the dicing lanes to define one or more second gaps between areas of the second portion of the silicon nitride layer, wherein the one or more second gaps are aligned with the one or more first gaps;
   depositing a second fill material on the second portion of the silicon nitride layer and into the one or more second gaps;
   planarizing a top surface of the second portion of the silicon nitride layer such that the second fill material within the one or more second gaps is coplanar with the top surface of the second portion of the silicon nitride layer;
   forming one or more additional layers on the top surface of the second portion of the silicon nitride layer; and forming one or more optical devices on the one or more additional layers.

2. The method of claim 1 wherein the one or more dicing lanes includes a group of dicing lanes along which one or more first gaps and second gaps are defined.

3. The method of claim 2 wherein the group includes a repetitive spacing between each of the one or more dicing lanes.

4. The method of claim 1 wherein the one or more dicing lanes includes a group of dicing lanes having no gaps.

5. The method of claim 1 wherein the one or more first and second regions are selectively removed using a dicing saw or an etching process.

6. The method of claim 1 wherein the silicon wafer comprises a silicon-on-insulator series of layers.

7. The method of claim 1, wherein depositing the first portion of the silicon nitride layer on the silicon wafer comprising depositing the first portion of the silicon nitride layer directly on the silicon wafer.

8. The method of claim 1, wherein the one or more second gaps and the one or more first gaps are of a same size.

9. A method comprising:
depositing a first silicon nitride layer on a top surface of a semiconductor wafer;
forming one or more first gaps in the first silicon nitride layer;
depositing a first fill material on the first silicon nitride layer;
planarizing the first silicon nitride layer;
depositing a second silicon nitride layer across the first silicon nitride layer;
forming one or more second gaps in the second silicon nitride layer, wherein the one or more second gaps are aligned with the one or more first gaps;
depositing a second fill material across the second silicon nitride layer; and
planarizing the second silicon nitride layer.

10. The method of claim 9 wherein the semiconductor wafer comprises a silicon wafer.

11. The method of claim 9 wherein the one or more first and second gaps are formed using a dicing saw or an etching process.

12. The method of claim 9 wherein the one or more first and second gaps are formed along one or more dicing lanes.

13. The method of claim 12 wherein the one or more dicing lanes includes a group of dicing lanes along which one or more first and second gaps are formed.

14. The method of claim 13 wherein the group includes a repetitive spacing between each of the one or more dicing lanes.

15. The method of claim 12 wherein the one or more dicing lanes includes a group of dicing lanes having no gaps.

16. The method of claim 9 wherein the one or more first and second gaps are formed within one or more active regions of semiconductor die defined across the semiconductor wafer.

17. The method of claim 9 wherein the first and second fill materials comprise flowable silicon dioxide.

18. The method of claim 9 wherein the semiconductor wafer comprises a silicon-on-insulator series of layers.

19. The method of claim 9 further comprising depositing one or more additional layers on the second silicon nitride layer and forming one or more optical devices on the one or more additional layers.

20. The method of claim 9, wherein depositing the first silicon nitride layer on the top surface of the semiconductor wafer comprises depositing the first silicon nitride layer directly on the top surface of the semiconductor wafer.

21. The method of claim 9, wherein the one or more second gaps and the one or more first gaps are of a same size.

* * * * *